United States Patent

Croset et al.

[11] 4,268,535
[45] May 19, 1981

[54] PROCESS FOR GROWING A SUPERFICIAL DIELECTRIC STRUCTURE UPON A SUBSTRATE, MADE OF A CHEMICAL COMPOUND, COMPRISING AT LEAST TWO ELEMENTS

[75] Inventors: Michel Croset; Gonzalo Velasco, both of Paris, France

[73] Assignee: Thomson-CSF, Paris, France

[21] Appl. No.: 70,043

[22] Filed: Aug. 27, 1979

Related U.S. Application Data

[63] Continuation of Ser. No. 940,664, Sep. 8, 1978, abandoned.

[30] Foreign Application Priority Data

Sep. 12, 1977 [FR] France .............................. 77 27470

[51] Int. Cl.$^3$ ............................................. B05D 3/06
[52] U.S. Cl. ..................................... 427/38; 148/6.3; 204/38 A; 427/419.3
[58] Field of Search ............... 427/380, 39, 419 B; 148/6.3; 204/15, 38 A, 56 R

[56] References Cited

U.S. PATENT DOCUMENTS

| | | | |
|---|---|---|---|
| 2,868,702 | 1/1959 | Brennan | 148/6.3 |
| 3,362,842 | 1/1968 | Kramer | 427/419 B |
| 3,915,119 | 10/1975 | Roy et al. | 118/723 |
| 3,971,710 | 7/1976 | Romankiw | 204/56 R |
| 4,108,736 | 8/1978 | Rigo et al. | 204/38 A |
| 4,133,724 | 1/1979 | Hartnagel et al. | 204/38 A |

Primary Examiner—John H. Newsome
Attorney, Agent, or Firm—Cushman, Darby & Cushman

[57] ABSTRACT

In a process for producing a surface compound between a substrate and a reactive species a thin layer permeable to the species in question is deposited on the substrate. A particularly interesting case is the oxidation of a substrate of gallium arsenide, the thin layer being made from zirconia doped with lime.

5 Claims, 8 Drawing Figures

PROCESS FOR GROWING A SUPERFICIAL DIELECTRIC STRUCTURE UPON A SUBSTRATE, MADE OF A CHEMICAL COMPOUND, COMPRISING AT LEAST TWO ELEMENTS

CROSS REFERENCE TO RELATED APPLICATION

This is a continuation of our earlier application Ser. No. 940,664, filed Sept. 8, 1978 and now abandoned.

BACKGROUND OF THE INVENTION

The invention relates to a new process for producing a surface compound between a substrate and a reactive species.

The processes essentially employed for producing such compounds are anodic treatments or thermal treatments; these treatments have a number of difficulties. Thus in the anodic treatments, the specie present in the electrolytic bath may become incorporated in the grown anodic layer. This may result in many drawbacks such as the early destruction of the dielectric layer, dielectric losses due to ionic polarizations etc. In the particular case of anodic oxidation, oxide growth can occur by the transport of oxygen and cations. The transport numbers are termed respectively anionic ($t^-$), cationic ($t^+$), and $(t^+ + t^-) = 1$, the fractions of current transported respectively by these mobile positive and negative charge carriers during the growth. These numbers depend on the experimental conditions and on the nature of the oxidized substance. Dependent on their value are the particular properties of the oxide and the substrate oxide interface; thus for ($t^+ = 1$), the oxide being formed can come away from the substrate. Moreover, in the case of a substrate of formula $A_xB_y$, gallium arsenide for example, the transport numbers $t_A^+$ and $t_B^+$ may be different. Consequently, one of the two specie A or B may accumulate at the substrate insulating interface and create a more or less extended zone of poorly defined properties. In the thermal treatments in which the body to be treated is immersed in a suitable liquid, the active fluid must be clean otherwise certain impurities may be incorporated in the layer in the course of growth and, lastly, the substrate must be stable at the treating temperature.

An object of the invention is to provide a process whereby these drawbacks are at least partially avoided.

BRIEF DESCRIPTION OF THE INVENTION

According to the invention, there is provided a process for forming on a substrate a thin layer made from a chemical combination of the elements of which the substrate is formed with a plurality of predetermined fluids, wherein a thin layer permeable to said fluids is previously deposited on the surface of the substrate.

A better understanding of the invention will be had from the ensuing description with reference to FIGS. 1 to 8 which diagrammatically illustrate different aspects of the process according to the invention.

DETAILED DESCRIPTION OF THE DRAWINGS

Figure 1:
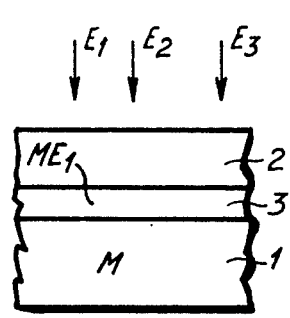
FIG. 1 is a cross-sectional view of a substrate of an element M subjected to the action of a mixture of free fluids.

In FIG. 1, a substrate 1 formed by an element M is subjected to the action of a mixture of fluids $E_1$, $E_n$. A thin layer 2 is deposited on this substrate and allows through, in the course of a chemical treatment, exclusively the species $E_1$. If $E_1$ can be form with M a chemical combination $E_{1X}M_Y$ which will be designated hereinafter by $ME_1$, a layer 3 of this combination will be formed at the interface 1-2, the thickness of this layer depending on the duration of this treatment.

Figure 2:
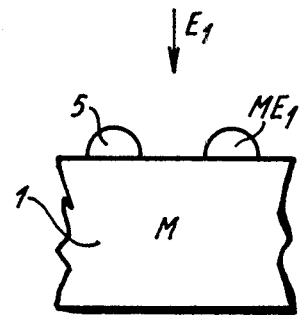
FIG. 2 is a cross-sectional view of a substrate M subjected to the attack of a gas $E_1$ the substrate being unstable at the treatment temperatures and islands forming on the surface of the substrate (not according to the invention).
Figure 3:
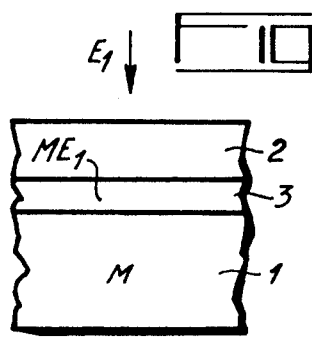
FIGS. 3-5 are cross-sectional views of substrates M being subjected to the attack of a fluid $E_1$.

The advantages of the process according to the invention may be illustrated by the following examples:

(a) FIG. 2 shows a substrate made from a body M subjected to the action of the gas $E_1$, this body being unstable at the treatment temperature. On the surface of the body in FIG. 2 there are seen islands 5 of the compound $ME_1$, the material between the islands having being destroyed in the course of the treatment. The presence of the layer 2 in FIG. 3 permits overcoming this defect and there is obtained an even layer 3 of the compound $ME_1$.

Figure 4:
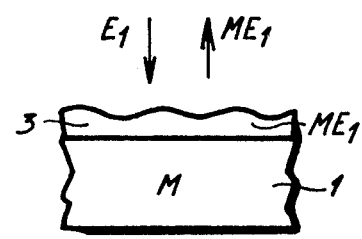
Figure 5:
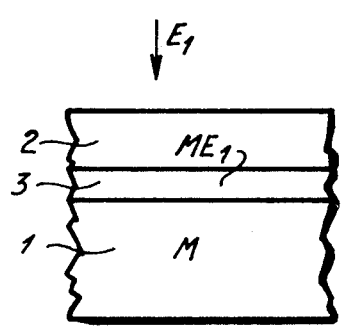

(b) In FIG. 4, the product $ME_1$ of the reaction is unstable at the treatment temperature. It volatilizes at least in part and its thickness cannot be controlled. In FIG. 5, the product $ME_1$ is trapped by the layer 2 and forms a layer 3. The same case can occur if M is a compound of two elements A and B, each forming a chemical combination with $E_1$, one of them, for example $AE_1$, being unstable or volatile.

Figure 6:
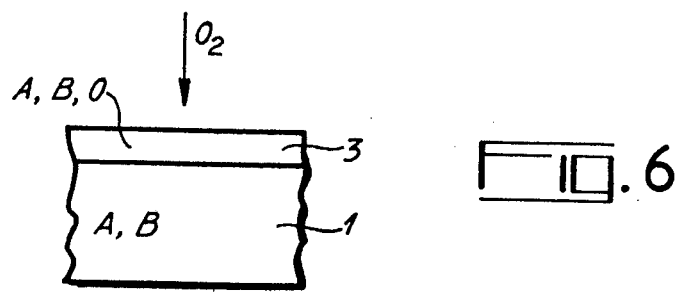
FIGS. 6-8 are cross-sectional views of a substrate of two elements A, B subjected to treatment in an oxygen atmosphere.
Figure 7:
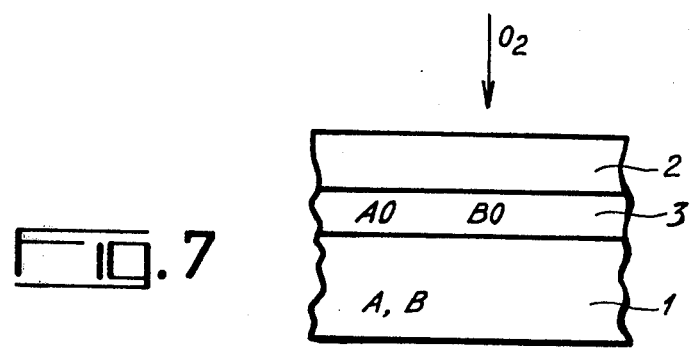

(c) FIG. 6 shows a substrate formed by two elements A and B subjected to an oxidation. If the transport numbers $t_A$ and $t_B$, are different, the layer 3 will be formed by oxides of variable composition which may be of reaction producing proportions or not. FIG. 7 shows that the layer 2 which opposes the transport of A and B there is always a layer 3 made from reaction producing oxide.

Note that, in the case of a thermal oxidation, the thin layer which is the exclusive conductor of oxygen can conduct it in the forms: $O_2$, $O$, $O^{-2}$; in the case of a conduction by $O^{-2}$, the thin layer must also be conductive of the electrons in order to ensure the reactions:

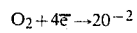

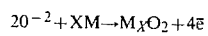

Figure 8:
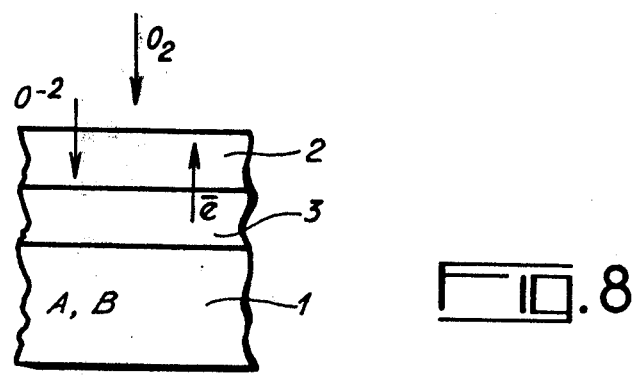

(d) In FIG. 8, in the case of thermal or anodic oxidation, impure fluids containing free oxygen or combined oxygen may be used. For example, the thermal oxidation in air of a body sensitive to nitrogen may be envisaged provided that the layer 2 is impermeable to nitrogen.

DESCRIPTION OF THE PREFERRED EMBODIMENTS

There will be given by way of example processes for the oxidation of gallium arsenide: Ga As is a thermally unstable compound, the transport numbers ($t^+_{Ga}$) and ($t^+_{As}$) are different. Moreover, note that the problem of the reaction producing formation of oxide on the surface has not been heretofore solved by processes other than that of the invention. These examples are consequently of particular interest and show the value of the process according to the invention. The surface of Ga As is covered with a thin layer permeable to oxygen at least; the thermal or anodic oxidation is then carried out as in the conventional techniques; the purity of the oxidizing medium, gas, electrolyte or plasma, is then to be defined as a function of the selectivity of the thin layer (in particular in the case where the latter is an exclusive conductor of oxygen there is no longer need to care about the purity of the oxidizing medium). After treatment, the thin layer, conductive of oxygen, may be dissolved selectively or conserved, as desired.

EXAMPLES

EXAMPLE 1

Thermal oxidation of gallium arsenide:

A thin layer (for example 2000 Å) of zirconia doped with lime is deposited on a substrate of Ga As by radio-frequency cathode sputtering from a stabilized zirconia cathode. The process to be employed is described in the article in J.A.P. vol. 48, n° 2 (1977) p. 775. A level of the doping of the zirconia by the lime is chosen to be compatible with the existence of the cubic phase, fluorite type (15% molecular for example). The sample is then put into an oven an swept by oxygen or air; the time and the temperature are so chosen as to obtain the desired oxide thickness. By way of example, with air at 850° C. for one hour, there is obtained an oxide layer compatible with its use in MOS technology.

EXAMPLE 2

Anode oxidation of Ga As:

The sample covered with 2000 Å of doped zirconia is put in an electrolytic oxidation bath as an anode. The anode assembly may be identical to that described in Rev. Sci. Instr., vol 37, n° 123 (1966). The cathode may be of platinium. An oxidation current of 1 mA/cm$^2$ is created between the anode and cathode by means of a stabilized DC supply. As the oxide increases, the anode-cathode voltage also increases and the latter may serve to measure the former. An increase of 100 V corresponds to about 2000 Å of oxide.

EXAMPLE 3

Plasma oxidation of Ga As:

The sample covered with 2000 Å of doped zirconia is plunged in an oxygen plasma produced by radio-frequency. An increasing anode voltage is applied to the sample. The procedure is similar to that described in Example n° 2.

What we claim is:

1. A process for growing a superficial dielectric structure on a gallium arsenide substrate comprising the steps of:
   (a) depositing on said gallium arsenide substrate an oxygen permeable layer of zirconia doped with calcium oxide and thus forming a solid electrolyte, oxygen-permeable layer on said substrate, and thereafter;
   (b) subjecting the layer-coated substrate to treatment in an atmosphere comprising oxygen,
   the layer-coated substrate substantially completely devoid of oxides produced on the gallium arsenide layer.

2. The process of claim 1, wherein the oxygen-permeable layer has a thickness of about 2000 A.U.

3. The process of claim 1 or 2, wherein the treatment of step (b) is made in an air atmosphere at a temperature of about 850° C.

4. The process of claim 1 or 2, wherein step (b) is an anodic oxidation.

5. The process of claim 1 or 2, wherein step (b) is an oxygen plasma oxidation.

* * * * *